United States Patent [19]

Gartner

[11] Patent Number: 5,618,395
[45] Date of Patent: Apr. 8, 1997

[54] METHOD OF PLASMA-ACTIVATED REACTIVE DEPOSITION OF ELECTRICALLY CONDUCTING MULTICOMPONENT MATERIAL FROM A GAS PHASE

[75] Inventor: Georg Gartner, Aachen, Germany

[73] Assignee: U.S. Philips Corporation, New York, N.Y.

[21] Appl. No.: 642,016

[22] Filed: May 2, 1996

Related U.S. Application Data

[62] Division of Ser. No. 389,446, Feb. 15, 1995, Pat. No. 5,549,937, which is a continuation of Ser. No. 133,544, Oct. 7, 1993, abandoned, which is a continuation-in-part of Ser. No. 879,058, Apr. 30, 1992, abandoned, which is a continuation of Ser. No. 595,118, Oct. 9, 1990, abandoned.

[30] Foreign Application Priority Data

Oct. 11, 1990 [DE] Germany .................. 39 33 900.9

[51] Int. Cl.$^6$ ............................................. C25B 11/00
[52] U.S. Cl. ................................................. 204/290 R
[58] Field of Search .................... 204/290 R; 429/209, 429/218

[56] References Cited

U.S. PATENT DOCUMENTS

| | | | |
|---|---|---|---|
| 5,098,546 | 3/1992 | Kawashima et al. | 204/290 R |
| 5,169,508 | 12/1992 | Suzuki et al. | 204/290 R |
| 5,248,401 | 9/1993 | Bridger et al. | 204/290 R |

*Primary Examiner*—Bruce F. Bell
*Attorney, Agent, or Firm*—Leroy Eason

[57] ABSTRACT

Uniform electrically conducting multicomponent material is deposited on an electrically conducting substrate by means of a PCVD method. A plasm, for example a glow discharge plasm, a high frequency plasm or a microwave plasm is generated in a reaction space. The plasma is periodically reciprocated. Starting materials for the single components of the multicomponent material are added to a flowing gas phase. To obtain multicomponent material of the desired composition, the flowing gas phase is split into at least two flowing gas phases each comprising only starting materials for a single component of the multicomponent material. The separate gas phases are time sequentially applied to the plasma. The deposited multicomponent material my be subjected to a thermal treatment.

4 Claims, 3 Drawing Sheets

METHOD OF PLASMA-ACTIVATED REACTIVE DEPOSITION OF ELECTRICALLY CONDUCTING MULTICOMPONENT MATERIAL FROM A GAS PHASE

RELATED APPLICATIONS

This is a divisional of application Ser. No. 08/389,446, filed Feb. 15, 1995, now U.S. Pat. No. 5,549,937, which is a continuation application of Ser. No. 08/133,544, filed Oct. 7, 1993, now abandoned, which is a continuation-in-part of application Ser. No. 07/879,058 filed Apr. 30, 1992, now abandoned which is a continuation of application Ser. No. 07/595,118, filed Oct. 9, 1990, now abandoned.

FIELD OF THE INVENTION

The invention relates to a multilayer structure and a PCVD method, i.e. a method of plasma-activated reactive deposition of electrically conducting multicomponent material from a flowing gas phase on an electrically conducting substrate, in which a plasma is generated in a reaction space, the plasma is moved periodically with respect to the substrate between points of reversal and starting materials for the single components of the multicomponent material are added to the flowing gas phase.

BACKGROUND OF THE INVENTION

A similar method is known from EP-A-0,204,356. In the method described in this application a locally limited glow discharge zone, which is maintained during the deposition, is generated between an inner electrode and an outer electrode one of which is tubular and is used as a substrate for the material to be deposited.

A PCVD method in which a pulsed plasma and pressure pulses are used is known from EP-A-0,207,767.

The flowing gas phase in the method according to EP-A-0,204,356 preferably comprises as starting materials for the single components of the multicomponent materials at least one halide or carbonyl of tungsten, molybdenum, tantalum, niobium, rhenium, hafnium, iridium, osmium, platinum, rhodium, ruthenium, and/or zirconium and at least one metalorganic compound of an element of the group III b of the periodic system (scandium group) as well as an inert gas and possibly hydrogen.

The manufacture, described in EP-A-0,204,356, of multicomponent material by PCVD from one gas mixture is to be understood as simultaneous PCVD.

SUMMARY OF THE INVENTION

In experiments which have led to the invention it has been found that in the known method metalorganic starting compounds can be satisfactorily used at molar ratios of W:Th (or another element from the IIIB-group of the periodic system) in the range of approximately 20:1 without too much unwanted carbon or unwanted fluorine being deposited, but this no longer holds true when the molar ratio is modified by one order of magnitude and a mixture instead of a doping is to be manufactured for example, the components W:Sc in a molar ratio of 2:1 or 3:1.

The invention has for its object to provide a PCVD method by which electrically conducting multicomponent material of a uniform composition is obtained.

To achieve this object the flowing gas phase in a method of the type described in the opening paragraph according to the invention is split into at least two flowing gas phases each comprising only starting material for a single component of the multicomponent material, while the single gas phases are repeatedly and time-sequentially applied to the plasma.

The plasma is, for example, a glow discharge plasma, a high-frequency plasma or a microwave plasma.

The single gas phases are preferably applied to a localized d.c. glow discharge plasma which is formed between two electrodes which are movable relative to each other and is periodically reciprocated between two points of reversal; the plasma is also continuously maintained when switching the gas phases. The use of a pulsed plasma should thus be avoided.

In the method according to the invention it is advantageous to perform intermediate plasma treatments intermittently without using the starting materials of the main components of the multicomponent material. Main components are generally those elements which in an uncombined form are present as metals.

The method according to the invention is preferably carried out in a reactor in which the pressure is maintained constant throughout the period of operation, while the mass flows of all gas components also remain constantly adjusted and the components which are not required are conducted to a gas disposal station via a lead bypassing the reactor. The use of pressure pulses is therefore to be avoided.

Further advantageous embodiments of the method according to the invention are

- the flowing gas phases are reciprocated between the points of reversal during the subintervals of the plasma movement,
- in the subintervals of the plasma movement the gas phase is reciprocated between the single reactive mixtures and the additional intermediate plasma treatments,
- after an integral number of strokes of the plasma movement the axial coating with the layer components deposited in the subintervals corresponds to the coating between two alternating strokes in accordance with the basic embodiment of the method according to the invention,
- the stroke H of the plasma movement which should be larger by a multiple than the half-value width d of the static PCVD deposition profile is divided into a plurality ($=m$) of partial strokes $H_i$ in such a way that its number m, which is equal to the number of subintervals of the movement, is larger than H/d,
- the flowing gas phases comprise as starting materials metal halide of tungsten, molybdenum, ruthenium, tantalum and niobium and metalorganic compounds of the scandium group, the rare earths and/or the actinides,
- there is reciprocation between the gas phases $WF_6/H_2/Ar$ and $Sc(C_5H_7O_2)/Ar$ and $Ar/O_2$ and Ar, with a plasma being formed each time,
- the deposited multicomponent material is subjected to a thermal treatment.

Since AES depth profiles of the multicomponent material manufactured in accordance with EP-A-0,204,356 always have a relatively strong concentration modulation of the single components (in this case substantially scandium and tungsten) due to the different static concentration profiles for the single components, an alternating PCVD of, for example, scandium on the one hand and tungsten on the other hand is performed according to the invention instead of the simultaneous PCVD according to EP-A-0,204,356. For the single strokes, i.e. for a reciprocating movement the gas mixtures, for example $WF_6/H_2/Ar$ and $Sc(C_5H_7O_2/O_2/Ar$ are reciprocated in a reactor or by way of a bypass via magnetic valves or electropneumatic valves, and after deposition of the scandium-containing layer ($Sc_2O_3$ layer) an $Ar/O_2$ intermediate plasma treatment may be performed.

AES stands for Auger Electron Spectroscopy, i.e. a surface examination method of determining the distribution of the elements or the composition of the surface in multimaterial systems.

Satisfactorily adhesive $W(ScC+Sc_2O_3)$ multilayer structures are obtained by means of the inventive alternating PCVD method, possibly with an intermittently performed intermediate plasma treatment, while the remaining C portion (approximately ½ of the original 3×5=15 C of $Sc(C_5H_7O_2)_3$) disappears by heating at scandate cathode operating temperatures, the monolayer structure being substantially compensated by means of interdiffusion and a mixture of scandium oxide and tungsten being obtained in the overall coating. For a satisfactory interdiffusion it is, however, also essential to considerably reduce the thickness of the single layers by using a plurality of measures:

(1) the $WF_6(/H_2)$ and $Sc(C_5H_7O_2)_3$ mass flows are reduced.

(2) the period is reduced by means of measures relating to the apparatus, for example, from 1 min to 40 s, i.e. 20 s per stroke, or shorter.

(3) the speed of the plasma movement is increased, for example from at most 19 cm/min to 57 cm/min (at a now doubled stroke of 19 cm) or it is even further increased.

As a result, the thickness of the "double" layer per period (depth modulation "period") is reduced from approximately 1 μm to 60 nm.

"Depth modulation "period"" is understood to mean periodically repetitive spatial sequence of the concentration modulation in the direction of the layer growth.

All modifications mentioned hereinbefore are to be considered in comparison with the examples described in EP-A-0,204,356.

For a further improvement of the interdiffusion (better compensation of the concentration), particularly also in the proximity of the surface it is essential to perform an important modification of the method according to the invention as mentioned hereinbefore:
since the speed of the plasma movement is limited in relation to the apparatus, the flowing gas phases (gas flows) are reciprocated between the points of reversal also in the subintervals. For a very narrow static profile and a comparatively large stroke such a procedure does not have any effect on a depth profile which is modulated at a higher frequency, but an additional sub-periodic modulation of the depth profile is realized at a larger extension of the static profile (for example 7 cm at a stroke of 19 cm). By means of a process computer control the time between the points of reversal at which interruption signals occur is divided into m equal intervals, thus into subintervals, and the gas flows are switched at the end or the start of each interval. The subinterval periods should be longer than the gas exchange periods in the reaction space, which condition is satisfied, for example, at subinterval periods of 3 s or more. Some embodiments of the invention are shown in the accompanying drawings and will be further described hereinafter.

BRIEF DESCRIPTION OF THE DRAWINGS

The drawings show five diagrams (FIGS. 1 to 5) of time-sequential plans for the gas flows in the subintervals for the method and with the apparatus in accordance with EP-A-0,204,356 in which the inner electrode is reciprocated in or periodically controlled way in the direction of the tube and along the outer electrode and in which the inner electrode is the anode and the outer electrode is the cathode, while the condition is satisfied that in each period or in two or four successive periods of movement the same overall concentration of the single components as in the stroke-alternating PCVD method is obtained.

| Legenda of the FIGS. | |
|---|---|
| H | = stroke |
| $H_{auf}$ | = upward stroke |
| $H_{ab}$ | = downward stroke |
| $U_o$ | = upper point of reversal |
| $U_u$ | = lower point of reversal |
| A | = anode movement (= plasma movement) |
| S | = subinterval |
| 1, 2, 3, 4, 5, 6 | = enumeration of = the subintervals. |

Figure 1:
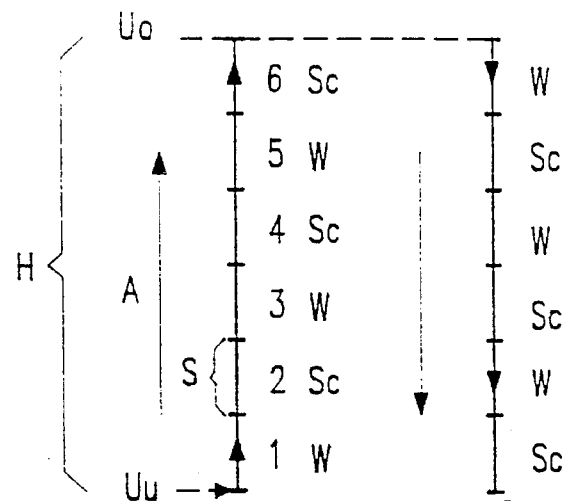
FIG. 1 shows a sequence without any intermediate plasma treatment, and one movement period (shown here for m even, m=6)

These symbols are only shown in FIG. 1 and are omitted in FIGS. 2 to 5 for the sake of simplicity. Other symbols in the FIGS. 1–5 are

| W | = | W-PCVD, for example with the reactive gas mixture $WF_6/H_2/Ar$ |
|---|---|---|
| Sc | = | Sc-PCVD, for example with the reactive gas mixture Sc $(C_5H_7O_2)_3/O_2/Ar$ in which Sc stands for the layer-determining components even when $SC_2O_3$ (+ScC) is actually deposited |
| $Ar/O_2$ | = | intermediate $Ar/O_2$ plasma treatment |
| Ar | = | intermediate Ar plasma treatment |

A period of the anode movement A is equal to the time interval $t_{per}$ ($t_{per}=t_{Hauf}+t_{Hab}$) at a uniform (linear) forward and backward movement between the lower point of reversal $U_u$, via the upper point of reversal $U_o$ and back to the lower point of reversal.

Figure 6:
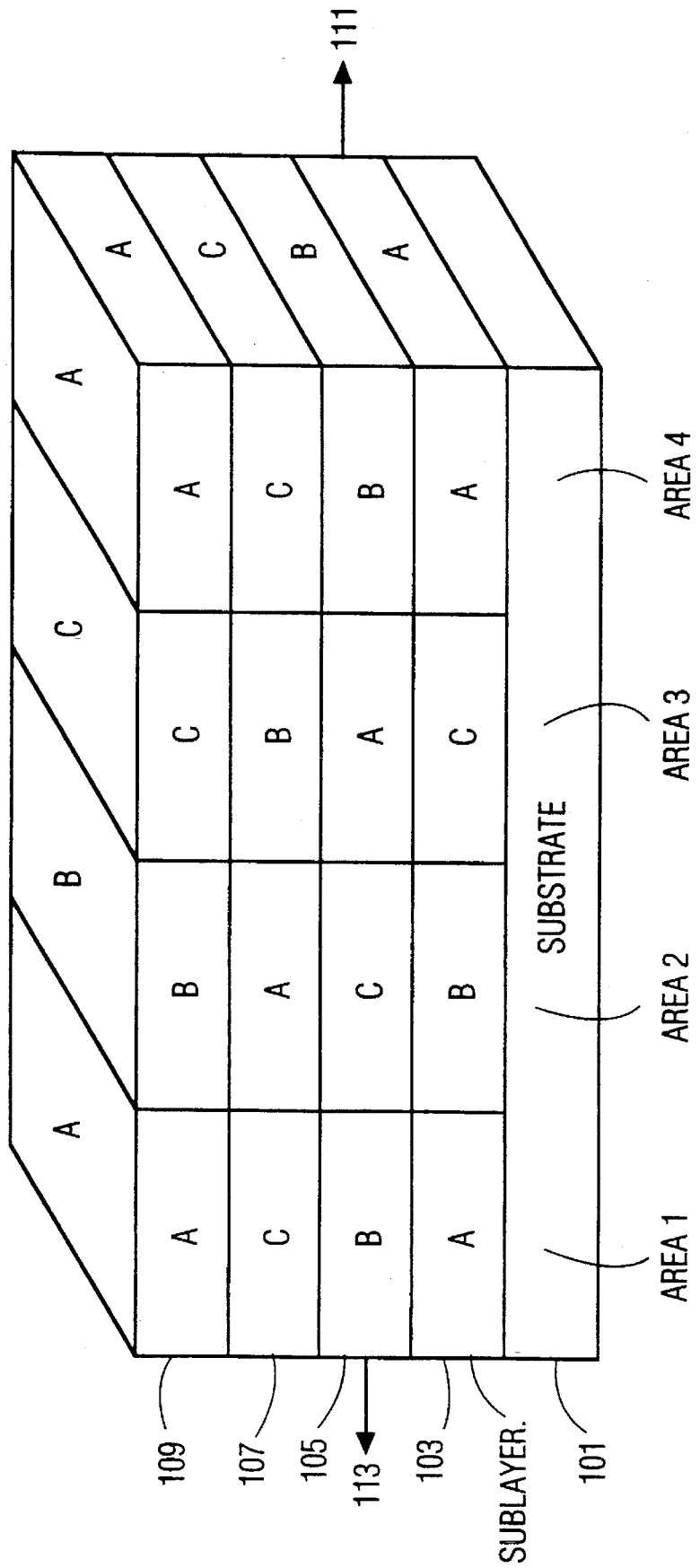

FIG. 6 is a cross-sectional view of a precursor layer for a multicompound structure provided by a method of the invention.

DESCRIPTION OF PREFERRED EMBODIMENTS

In accordance with FIG. 1 an alternating PCVD method without intermediate $AR(/O_2)$ plasma treatment is performed. The upper and lower points of reversal of the anode movement and the speed to be used have been adjusted. Upon the start of the anode at the lower point of reversal the gas mixture for W-PCVD (=$WF_6/H_2/Ar$) is passed through the reaction space until after $t_H/m$ the reactive gas mixture for Sc-PCVD, which as already noted stands for scandium-containing deposition, is passed through the reaction space while the gases which are not required always bypass the reaction space. In the subsequent subintervals having a period of $t_H/m$ the W-PCVD and Sc-PCVD methods alternate with each other until after $m(t_H/m)+m(t_H/m)$ intervals one period of the anode movement has been carried out. Such a period may be repeated several times.

Figure 2:
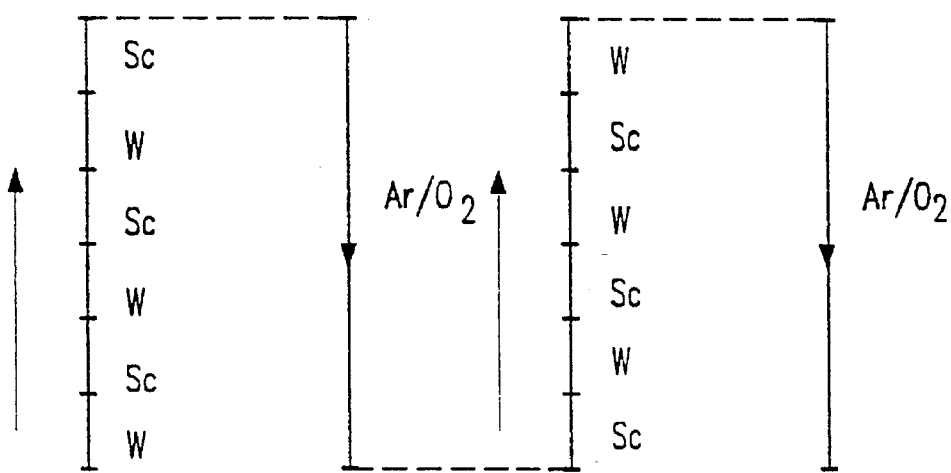
FIG. 2 shows a sequence with $Ar/O_2$ intermediate plasma treatment during complete strokes, a coating period, and two movement periods.

In contrast to FIG. 1, there is a change-over in the next stroke to Ar/O$_2$ plasma after a stroke of a period $m(t_H/m)$ in FIG. 2 and no subinterval change-overs of the gas phase are carried out during the period $t_H$ until the other point of reversal has been reached. At this point there is a change-over to the mixture for scandium-containing deposition until after $t_H/m$ the W-PCVD method is performed again. Subsequently, the Sc-PCVD and W-PCVD methods alternate with each other again during the successive subintervals of the period $t_H/m$ until the upper point of reversal is reached. An intermediate plasma treatment is carried out again from this upper point to the lower point for the entire $t_H$.

Figure 3:
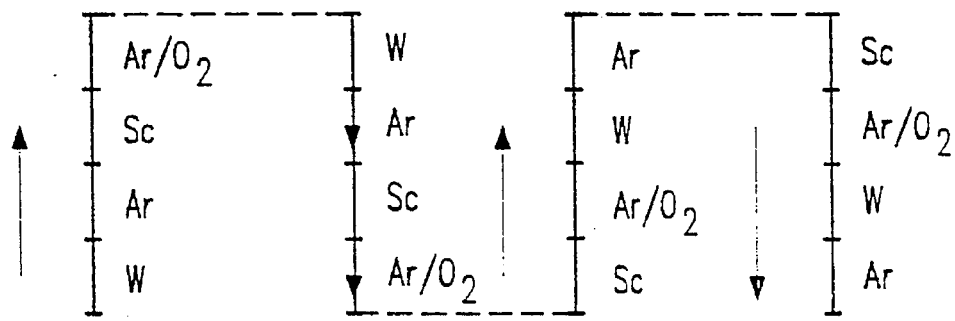
FIG. 3 shows sequences with an alternating PCVD and FIG. 4 shows an $Ar/O_2$ or intermediate Ar-plasma treatment (here m=4 or 5), two movement periods, start at the lower or the upper point of reversal.

In the sequence according to the FIG. 3 the glow discharge is maintained uninterruptedly in the reaction space during the entire process while the anode is reciprocated between the points of reversal at a uniform speed. The gas mixture is each time switched after $t_H$, i.e. after the start below there is a change-over from WF$_6$/H$_2$/Ar to Ar to Sc-compound/O$_2$/Ar to Ar/O$_2$. After the upper point of reversal; there is again a change-over during $t_H/m$ to WF$_6$/H$_2$/Ar, subsequently during the next subinterval to Ar and then to the Sc-compound/O$_2$/Ar and finally to Ar/O$_2$ until the lower point of reversal is reached. A W and an Sc-oxide coating is not yet provided during each subinterval, which can now also be observed locally, but this is realized in the next two strokes in the subinterval sequence Sc-PCVD—Ar/O$_2$—W-PCVD—Ar (upward) and Sc-PCVD—Ar/O$_2$—W-PCVD—Ar (downward). Such a coating sequence as described hereinbefore can now be repeated several times.

Figure 4:
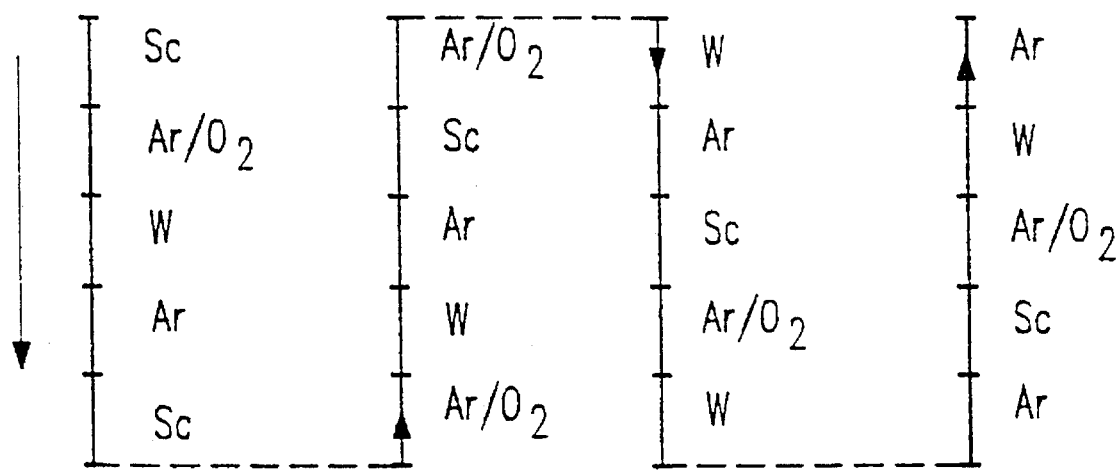

In accordance with FIG. 4 the start is at the upper point of reversal. Otherwise the sequence according to FIG. 4 is similar to the sequence according to FIG. 3. In the single sequence of FIG. 4 coated scandate cathodes having a high electron emission current density at 950° C. cathode temperature were obtained after coating with cathode pellets impregnated with 4 BaO.CaO.Al$_2$O$_3$.

Figure 5:
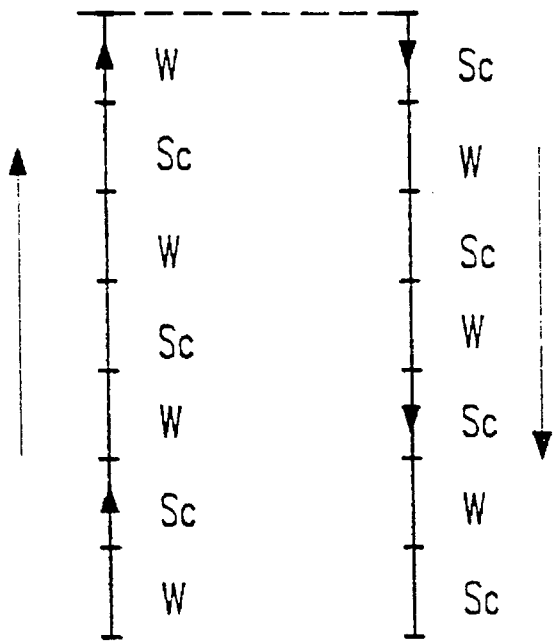
FIG. 5 shows a sequence in which m is odd (here m=7, subinterval=stroke).

According to FIG. 5 the time sequence is to be arranged in such a way that at each subinterval coating in the same axial interval also the complementary coating (with two components) is carried out. A coating with seven subintervals was carried out (intermediate treatment, for example possible after each stroke, but not performed). A small excess of W ($t_w:t_{Sc}$~4:3) occurs during the downward stroke and an excess of Sc occurs during the upward stroke.

Due to substrate unevenness which decrease the "depth dissolution" (see below) during sputtering, no substructure could be dissolved in AES depth profiles, but the modulation stroke of the single concentrations was clearly reduced and corresponded approximately to the small excess of W or Sc per stroke. A substructure of the in depth concentration which is irregular with respect to the static deposition profile is of course to be expected at an axial location z, but it is periodically repeated in many movement periods. The method according to the invention will be very useful and effective if the distance between two adjacent subinterval points of reversal (subinterval stroke) is smaller than or equal to the width of the static profile. Moreover, this method can be used for an additional homogenization when with two components the static maximum values are offset with respect to each other. The sequence is then to be such that the component which is deposited an a later stage in the flow direction is provided in the subinterval before the component which was the first to be statically deposited. The geometric subinterval stroke can then be effectively determined by way of anode speed and subinterval in such a way that it corresponds approximately to the distance between the two concentration maxima. In spite of an alternating PCVD the subinterval method thus provides the possibility of achieving a further thorough mixture in which the depth modulation of the concentration can be better and faster compensated by interdiffusion.

The characteristic layer thicknesses for the submodulation thus obtained are already in the range of 10 nm.

"Depth dissolution" means dissolution, i.e. spatial accuracy in the measurement or modification of the concentration in the direction of growth of the layer/s (=in depth, as viewed from the upper surface).

The classes for the starting materials are generally:

(a) metal halide, for example of tungsten, molybdenum, rhenium, tantalum and niobium, and (b) metalorganic compounds, for example of the scandium group, the rare earths and/or the actinides, for manufacturing phase compositions of metal-(metal) oxide. The method is, however, much more general for two-material systems and multimaterial systems and, for example, a nitride or carbide formation instead of an oxide formation may also be the object. Also all volatile compounds which are usable for CVD can be used while the subinterval phase composition is adjusted by reactive gas components such as, for example oxygen, hydrogen and nitrogen, hydrocarbons or suitable oxygen, nitrogen and carbon compounds.

Instead of a uniform anode movement, an appropriate non-uniform anode movement or plasma movement, for example, with speed controllers in front of the points of reversal may be carried out.

FIG. 6 shows in cross-section a precursor layer for a multicomponent structure formed in accordance with a method of the invention. Thus separate components A, B and C are alternately deposited on separate areas of a substrate 101 along a deposition path indicated by one of the arrows 111 or 113 to form a first sublayer 103. Second, third and fourth sublayers 105, 107 and 109 are then successively deposited, each of said sublayers 105, 107 and 109 also being alternatively formed of separate components A, B and C in such a manner that the components adjacently deposited one upon each other differ one from the other and upon deposition of all the sublayers 103, 105, 107 and 109 each area in a direction perpendicular to the substrate contains all of the components A, B and C.

I claim:

1. A substrate carrying a precursor layer for a multicomponent material layer, said precursor layer comprising a plurality of parallel sub-layers one deposited on top of the other, each sub-layer comprising a plurality of adjacent regions which regions each comprise a single component material of the multicomponent material, the distribution of the single component materials in the various sub-layers being such that in a cross section normal to said substrate the adjacent regions of each two adjacent sub-layers comprise different single component materials.

2. A substrate carrying a multicomponent material layer, obtained from a precursor layer comprising a plurality of parallel sub-layers one deposited on top of the other, each sub-layer comprising a plurality of adjacent regions which regions each comprise a single component material of the multicomponent material, the distribution of the single component materials in the various sub-layers being such that in a cross section normal to said substrate adjacent regions of each two adjacent sub-layers comprise different single component materials, the multicomponent material layer being obtained by interdiffusion of the single component materials of the precursor layer.

3. A cathode body comprising a multicomponent material layer, obtained from a precursor layer comprising a plurality of parallel sub-layers one deposited on top of the other, each sub-layer comprising a plurality of adjacent regions which regions each comprise a single component material of the multicomponent material, the distribution of the single component materials in the various sub-layers being such that in a cross section normal to said substrate adjacent regions of each two adjacent sub-layers comprise different single component materials, the multicomponent material layer being obtained by interdiffusion of the single component materials of the precursor layer.

4. A cathode having a cathode body comprising a multicomponent material layer, obtained from a precursor layer comprising a plurality of parallel sub-layers one deposited on top of the other, each sub-layer comprising a plurality of adjacent regions which regions each comprise a single component material of the multicomponent material, the distribution of the single component materials in the various sub-layers being such that in a cross section normal to said substrate adjacent regions of each two adjacent sub-layers comprise different single component materials, the multicomponent material layer being obtained by interdiffusion of the single component materials of the precursor layer, the cathode being obtained by providing the cathode body with emissive material.

* * * * *